(12) United States Patent
Lautensack et al.

(10) Patent No.: US 11,973,064 B2
(45) Date of Patent: Apr. 30, 2024

(54) SEMICONDUCTOR POWER MODULE

(71) Applicant: Robert Bosch GmbH, Stuttgart (DE)

(72) Inventors: Christian Marc Lautensack, Tuebingen (DE); Alexander Kaiser, Schoerzingen (DE); Jan Homoth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 400 days.

(21) Appl. No.: 17/421,307

(22) PCT Filed: Apr. 8, 2020

(86) PCT No.: PCT/EP2020/060011
§ 371 (c)(1),
(2) Date: Jul. 7, 2021

(87) PCT Pub. No.: WO2020/229063
PCT Pub. Date: Nov. 19, 2020

(65) Prior Publication Data
US 2022/0077119 A1    Mar. 10, 2022

(30) Foreign Application Priority Data
May 10, 2019   (DE) ...................... 10 2019 206 820.0

(51) Int. Cl.
*H01L 25/07* (2006.01)
*H01L 23/367* (2006.01)
(Continued)

(52) U.S. Cl.
CPC .......... *H01L 25/072* (2013.01); *H01L 23/367* (2013.01); *H01L 23/49524* (2013.01);
(Continued)

(58) Field of Classification Search
CPC ................. H01L 25/072; H01L 23/367; H01L 23/49524; H01L 23/49562;
(Continued)

(56) References Cited

U.S. PATENT DOCUMENTS

2014/0054967 A1* 2/2014 Toyoda ................... H02J 3/466
307/65
2015/0235923 A1 8/2015 Yasuda
(Continued)

FOREIGN PATENT DOCUMENTS

DE    10200407186 B3 * 10/2005 ......... H01L 23/5386
DE    102004027186 B3    10/2005
(Continued)

OTHER PUBLICATIONS

International Search Report for PCT/EP2020/060011, dated Jun. 15, 2020.

*Primary Examiner* — Moin M Rahman
*Assistant Examiner* — Eric Manuel Mulero Flores
(74) *Attorney, Agent, or Firm* — NORTON ROSE FULBRIGHT US LLP; Gerard A. Messina

(57) ABSTRACT

A semiconductor power module including first and second power transistors situated in parallel between first collector and first emitter strip conductors. A first connection surface of each of the power transistors is electroconductively connected to the first collector strip conductor, and a second connection surface of each of the power transistors is electroconductively connected to the first emitter strip conductor, so that a current flowing between the first collector strip conductor and the first emitter strip conductor is divided between the power transistors when the power transistors are each conductively connected via an applied control voltage. A first external power contact is directly contacted with the first collector strip conductor at a first contact area, a second external power contact is contacted (Continued)

with the first emitter strip conductor at a second contact area via a first connecting element, and the second contact area is positioned asymmetrically between the power transistors.

11 Claims, 4 Drawing Sheets

(51) Int. Cl.
    *H01L 23/495*     (2006.01)
    *H01L 23/498*     (2006.01)
    *H01L 25/18*     (2023.01)

(52) U.S. Cl.
    CPC .. *H01L 23/49562* (2013.01); *H01L 23/49894* (2013.01); *H01L 25/18* (2013.01)

(58) Field of Classification Search
    CPC ............... H01L 23/49894; H01L 25/18; H01L 27/0623; H01L 27/0629; H01L 27/0647; H01L 27/0652; H01L 27/0664; H01L 27/0255; H01L 27/07; H01L 27/0711; H01L 27/0716; H01L 27/0722; H01L 27/075; H01L 27/0755; H01L 25/071; H01L 25/112; H01L 25/115; H01L 29/0603; H01L 29/7302; H01L 29/0804; H01L 29/0821; H01L 29/41708; H01L 23/40–4093; H01L 29/06–10; H01L 29/417–41791; H01L 29/68–749; H01L 25/04; H01L 25/07–074; H01L 25/10; H01L 25/11–117; H01L 29/66325–66348; H01L 29/7393–7398; H01L 2924/13055
    See application file for complete search history.

(56) References Cited

U.S. PATENT DOCUMENTS

2015/0270199 A1\*   9/2015   Sunaga ................. H01L 23/057
                                                                                                                      257/288
2017/0328934 A1\*   11/2017  Mayell ................ H01L 27/0623
2019/0157221 A1\*   5/2019   Soyano ............ H01L 23/49568

FOREIGN PATENT DOCUMENTS

DE       102014111931 A1    2/2016
WO        2018142863 A1    8/2018

\* cited by examiner

SEMICONDUCTOR POWER MODULE

The present invention relates to a semiconductor power module that includes a first power transistor and a second power transistor that are situated in parallel between a first collector strip conductor and a first emitter strip conductor. A first connection surface of the power transistors is in each case electroconductively connected to the first collector strip conductor, and a second connection surface of the power transistors is in each case electroconductively connected to the first emitter strip conductor, so that a current flowing between the first collector strip conductor and the first emitter strip conductor is divided between the two power transistors when the power transistors are each conductively connected via an applied control voltage.

BACKGROUND INFORMATION

The power electronics for hybrid electric vehicles or electric vehicles together with associated semiconductor power modules are increasingly subject to large installation space requirements, as the result of which the semiconductor power modules together with electrical supply lines have smaller designs. At the same time, the current density increases due to increased power requirements. However, smaller supply lines and higher currents result in greater electrical losses (ohmic as well as frequency-related). Therefore, semiconductor power modules that are optimized for installation space are generally mechanically built up in the longitudinal direction, but this results in the electrical properties being highly asymmetrical. For this reason, for a parallel connection of power transistors, a first power transistor may take over the switching-on operation and a second power transistor may take over the switching-off operation. In particular when deactivating a short circuit, the short circuit capability may be greatly limited as a result.

FIG. 2 shows by way of example a conventional semiconductor power module 1' the related art, designed as a so-called B2 bridge 1A', that includes four power transistors 5LA, 5LB, 5HA, 5HB designed as insulated gate bipolar transistors (IGBTs), and two free-wheeling diodes 3L, 3H. As is further apparent from FIG. 2, a first power transistor 5LA, a second power transistor 5LB, and a first free-wheeling diode 3L are situated between a first collector strip conductor 11L and a first emitter strip conductor 9L, and form a low side of semiconductor power module 1'. In addition, a third power transistor 5HA, a fourth power transistor 5HB, and a second free-wheeling diode 3H are situated between a second collector strip conductor 11H and a second emitter strip conductor 9H, and form a high side of semiconductor power module 1'. The two collector strip conductors 11L, 11H are spaced apart from one another in the same plane and are coupled to a cooling device, not illustrated. Therefore, the two collector strip conductors 11L, 11H each act as a heat sink for dissipating heat from semiconductor power module 1. The four power transistors 5LA, 5LB, 5HA, 5HB and the two free-wheeling diodes 3L, 3H are respectively situated on the two collector strip conductors 11L, 11H, a first connection surface of power transistors 5LA, 5LB, 5HA, 5HB and of free-wheeling diodes 3L, 3H being respectively electroconductively connected to a corresponding collector strip conductor 11L, 11H. A second connection surface of power transistors 5LA, 5LB, 5HA, 5HB and of free-wheeling diodes 3L, 3H is respectively electroconductively connected to a corresponding emitter strip conductor 9L, 9H. In addition, the heat of power transistors 5LA, 5LB, 5HA, 5HB and of free-wheeling diodes 3L, 3H is dissipated via collector strip conductor 11L, 11H, respectively.

As is further shown FIG. 2, a first external power contact P at which an alternating voltage potential is present is connected to the surface of first collector strip conductor 11L at a first contact area KB1 and undergoes heat dissipation via same. A second external power contact TL at which a first direct voltage potential is present is connected to first emitter strip conductor 9L at a second contact area KB2 and undergoes heat dissipation via the first emitter strip conductor, via power transistors 5LA, 5LB and free-wheeling diode 3L, and via first collector strip conductor 11L. A third external power contact TH at which a second direct voltage potential is present is connected to the surface of second collector strip conductor 11H at a third contact area KB3 and undergoes heat dissipation via same. Second emitter strip conductor 9H is electrically connected to first collector strip conductor 11L at a fourth contact area KB4 via a connecting element. In addition, illustrated semiconductor power module 1 includes even further external contacts KH, EH, G1H, G2H, KL, EL, G1L, G2L. External contact KL is connected to first collector strip conductor 11L or to collector terminals of power transistors 5LA, 5LB of the low side of semiconductor power module 1' via a bonding wire. External contact EL is connected to first emitter strip conductor 9L or to emitter terminals of power transistors 5LA, 5LB of the low side of semiconductor power module 1' via a bonding wire. External contact G1L is connected to a gate terminal of first power transistor 5LA of the low side of semiconductor power module 1' via a bonding wire. External contact G2L is connected to a gate terminal of second power transistor 5LB of the low side of semiconductor power module 1' via a bonding wire. Analogously, external contact KH is connected to second collector strip conductor 11H or to collector terminals of power transistors 5HA, 5HB of the high side of semiconductor power module 1' via a bonding wire. External contact EH is connected to second emitter strip conductor 9H or to emitter terminals of power transistors 5HA, 5HB of the high side of semiconductor power module 1' via a bonding wire. External contact G1H is connected to a gate terminal of third power transistor 5HA of the high side of semiconductor power module 1' via a bonding wire. External contact G2H is connected to a gate terminal of fourth power transistor 5HB of the high side of semiconductor power module 1 via a bonding wire.

SUMMARY

A semiconductor power module in accordance with an example embodiment of the present invention may have the advantage that the effective inductances and ohmic resistances of the two power transistors situated in parallel between a first collector strip conductor and a first emitter strip conductor are adapted to one another via a particular line routing. This results in symmetrical control voltages at the two parallel power transistors, and in uniform switching on and switching off, so that the energy input is equally distributed over the two parallel power transistors during normal operation and in the event of a short circuit. An ideal chip surface area for both power transistors may thus be determined during normal operation. In the event of a short circuit, the equal distribution of the currents results in maximum utilization of the thermal destruction limit of the two power transistors. In addition, due to the electrical symmetry with equal effective control voltages at the two power transistors, the distance between the two parallel power transistors may be increased, thus enabling a better cooling connection.

Specific example embodiments of the present invention provide a semiconductor power module that includes a first power transistor and a second power transistor that are situated in parallel between a first collector strip conductor and a first emitter strip conductor, in each case a first connection surface of the power transistors being electroconductively connected to the first collector strip conductor, and in each case a second connection surface of the power transistors being electroconductively connected to the first emitter strip conductor, so that a current flowing between the first collector strip conductor and the first emitter strip conductor is divided between the two power transistors when the power transistors are each conductively connected via an applied control voltage. A first external power contact is directly contacted with the first collector strip conductor at a first contact area. A second external power contact is contacted with the first emitter strip conductor at a second contact area via a first connecting element, the second contact area being positioned mechanically asymmetrically between the power transistors connected to the first emitter strip conductor in such a way that an electrical symmetry with identical effective control voltages results at the two power transistors.

Advantageous improvements of the semiconductor power module in accordance with the present invention are possible due to measures and refinements set forth herein.

It is particularly advantageous if a third power transistor and a fourth power transistor may be situated in parallel between a second collector strip conductor and a second emitter strip conductor, it being possible in each case for a first connection surface of the power transistors to be electroconductively connected to the second collector strip conductor, and it being possible in each case for a second connection surface of the power transistors to be electroconductively connected to the second emitter strip conductor, so that a current flowing between the second collector strip conductor and the second emitter strip conductor may be divided between the two power transistors when the power transistors are each conductively connected via an applied control voltage. A third external power contact may be directly contacted with the second collector strip conductor at a third contact area, and the second emitter strip conductor may be contacted with the first collector strip conductor at a fourth contact area via a second connecting element. In addition, the first power transistor and the second power transistor connected in parallel may form a low-side path between the second external power contact and the first external power contact, and the third power transistor and the fourth power transistor connected in parallel may form a high-side path between the third external power contact and the first external power contact. In addition, a first free-wheeling diode may be situated in parallel with the first power transistor and with the second power transistor, between the first collector strip conductor and the first emitter strip conductor. A second free-wheeling diode may be situated in parallel with the third power transistor and with the fourth power transistor, between the second collector strip conductor and the second emitter strip conductor. The semiconductor power module may thus be used as a B2 bridge, an alternating voltage potential then being present at the first external power contact, a first direct voltage potential being present at the second external power contact, and a second direct voltage potential being present at the third external power contact. The power transistors may be designed, for example, as insulated gate bipolar transistors (IGBTs), metal oxide semiconductor field effect transistors (MOSFETs), etc.

In a further advantageous embodiment of the semiconductor power module in accordance with the present invention, the fourth contact area may be positioned mechanically and electrically symmetrically between the two power transistors, based on the distance between the third power transistor and the fourth power transistor connected in parallel. This results in symmetrical control voltages at the two parallel power transistors, and in uniform switching on and switching off, so that the energy input is equally distributed over the two parallel power transistors during normal operation and in the event of a short circuit.

In a further advantageous embodiment of the semiconductor power module in accordance with the present invention, the second contact area may be mechanically shifted in the direction of the second power transistor, which is spatially farther from the second power contact than is the first power transistor, based on the distance between the first power transistor and the second power transistor. As a result, the effective inductance and the effective ohmic resistance of the first power transistor are increased and the effective inductance and the effective ohmic resistance of the second power transistor are reduced, as the result of which the effective inductances and ohmic resistances of the two power transistors are adapted to one another.

In a further advantageous embodiment of the semiconductor power module in accordance with the present invention, a first control voltage may be applied between an external emitter contact and a first external gate contact that is connected to a control connection of the first power transistor. Furthermore, a second control voltage may be applied between the external emitter contact and a second external gate contact that is connected to a control connection of the second power transistor. In addition, the external emitter contact may be connected to the first emitter strip conductor at an emitter contacting point. The emitter contacting point with the first emitter strip conductor may be mechanically shifted in the direction of the first power transistor, based on the distance between the first power transistor and the second power transistor.

In a further advantageous embodiment of the semiconductor power module in accordance with the present invention, the first connecting element may have a U-shaped design, so that an air gap is formed between the second connecting element and the second emitter strip conductor, except at the second contact area. This allows a particularly simple and cost-effective implementation of the positioning of the second contact area. In addition, the U-shaped design of the first connecting element allows a simple implementation of a heat dissipation path for dissipating heat from the second external power contact.

In a further advantageous embodiment of the semiconductor power module in accordance with the present invention, a heat dissipation system that includes an electrically insulating intermediate layer that is integrally joined to the first connecting element via a first solder layer and integrally joined to the first collector strip conductor via a second solder layer may be situated in the area of the second external power contact, it being possible for the electrically insulating intermediate layer to form an electrically insulated heat dissipation path between the first connecting element and the first collector strip conductor, which dissipates the heat of the second external power contact. Due to the electrically insulated heat dissipation path, it is possible to thermally couple the second external power contact of the semiconductor module, which is not directly contacted on the surface of a collector strip conductor which acts as a heat sink, to the first collector strip conductor which acts as a heat sink, and dissipate the heat therefrom. As a result, such external power contacts of the semiconductor power module may also be cooled, and the power loss may be discharged via the heat dissipation path of the semiconductor power module. Due to the heat dissipation system, the second external power contact is thermally coupled to the cooling system of the semiconductor power module, so that a defined dissipation of heat of the external power contact is possible. In addition, the thermal performance of the semiconductor power module is advantageously decoupled from power loss that is applied from the outside. Furthermore, the power transistors experience no additional heat input due to the connection to external busbars, and may thus be utilized in a more optimal manner.

One exemplary embodiment of the present invention is illustrated in the figures and explained in greater detail in the following description. In addition, a conventional semiconductor power module from the related art and described in the introduction is illustrated in the figures. Identical reference symbols in the drawings denote components or elements having the same or analogous functions.

DETAILED DESCRIPTION OF EXAMPLE EMBODIMENTS

Figure 1:
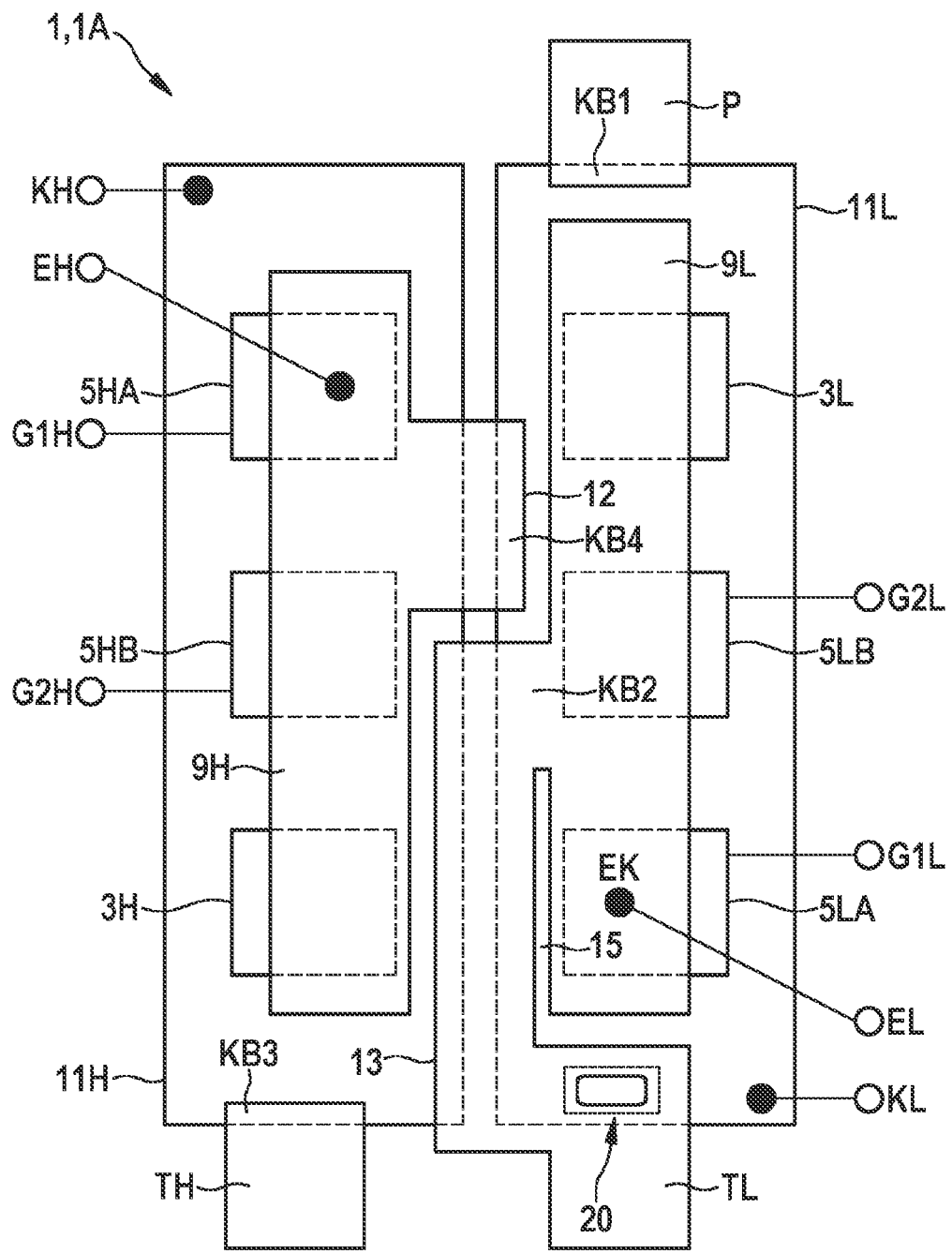
FIG. 1 shows a schematic illustration of one exemplary embodiment of a semiconductor power module according to the present invention.
Figure 3:
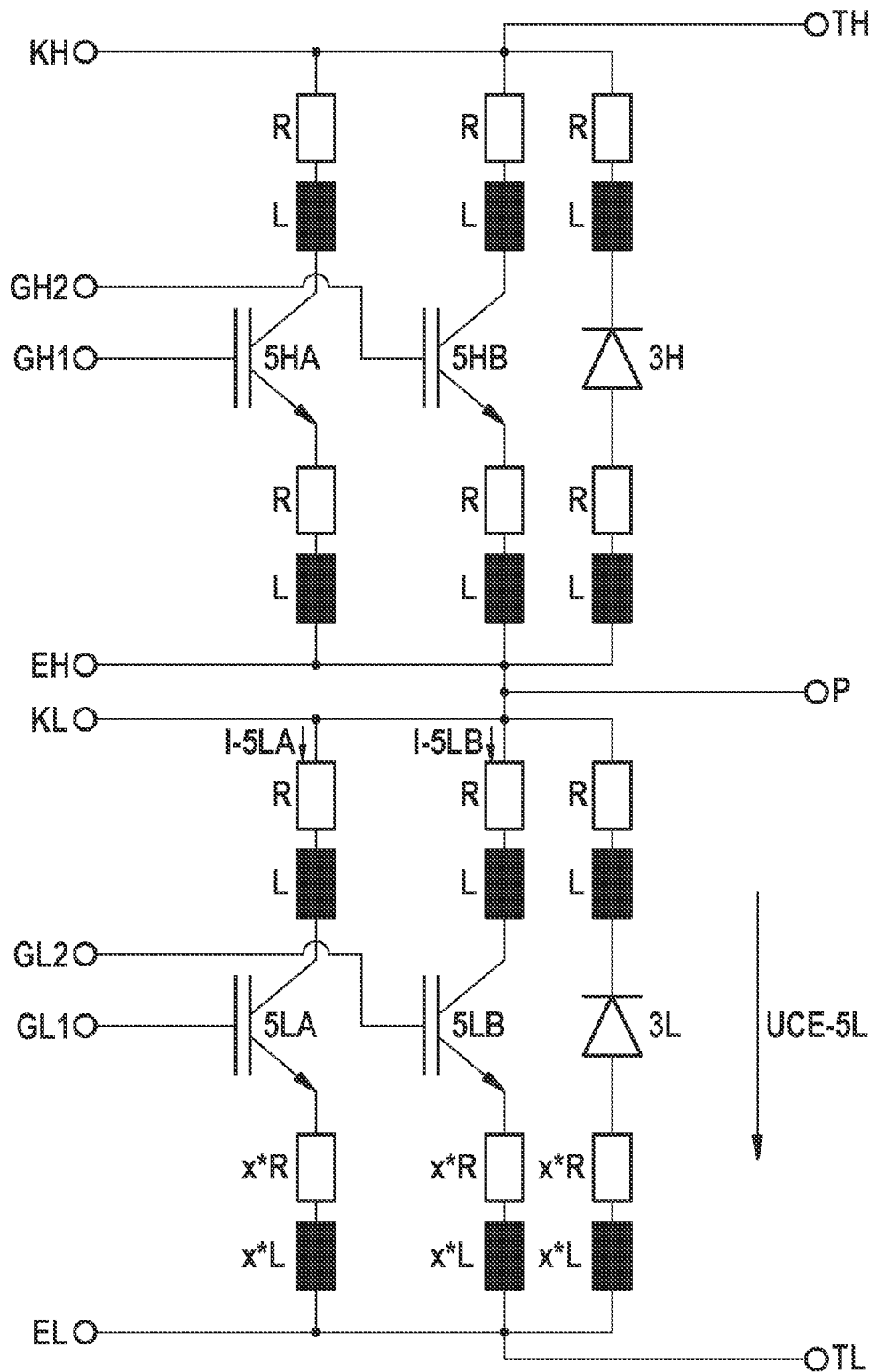
FIG. 3 shows a schematic electrical circuit diagram of the semiconductor power module according to the present invention from FIG. 1.

As is apparent from FIGS. 1 and 3, the illustrated exemplary embodiment of a semiconductor power module 1 according to the present invention includes a first power transistor 5LA and a second power transistor 5LB that are situated in parallel between a first collector strip conductor 11L and a first emitter strip conductor 9L, in each case a first connection surface of power transistors 5LA, 5LB being electroconductively connected to first collector strip conductor 11L, and in each case a second connection surface of power transistors 5LA, 5LB being electroconductively connected to first emitter strip conductor 9L, so that a current flowing between first collector strip conductor 11L and first emitter strip conductor 9L is divided between the two power transistors 5LA, 5LB when power transistors 5LA, 5LB are each conductively connected via an applied control voltage. A first external power contact P is directly contacted with first collector strip conductor 11 at a first contact area KB1. A second external power contact TL is contacted with first emitter strip conductor 9L at a second contact area KB2 via a first connecting element 13, second contact area KB2 being positioned mechanically asymmetrically between power transistors 5LA, 5LB connected to first emitter strip conductor 9L in such a way that an electrical symmetry with identical effective control voltages results at the two power transistors 5LA, 5LB.

As is further shown in FIGS. 1 and 3, illustrated semiconductor power module 1 includes a third power transistor 5HA and a fourth power transistor 5HB that are situated in parallel between a second collector strip conductor 11H and a second emitter strip conductor 9H, in each case a first connection surface of power transistors 5HA, 5HB being electroconductively connected to second collector strip conductor 11H, and in each case a second connection surface of power transistors 5HA, 5HB being electroconductively connected to second emitter strip conductor 9H, so that a current flowing between second collector strip conductor 11H and second emitter strip conductor 9H is divided between the two power transistors 5HA, 5HB when power transistors 5HA, 5HB are each conductively connected via an applied control voltage. In addition, a third external power contact TH is directly contacted with second collector strip conductor 11H at a third contact area KB3. Second emitter strip conductor 9H is contacted with first collector strip conductor 11L at a fourth contact area KB4 via a second connecting element 12. As is further apparent from FIG. 1, fourth contact area KB4 is positioned mechanically and electrically symmetrically between the two power transistors 5HA, 5HB, based on the distance between third power transistor 5HA and fourth power transistor 5HB connected in parallel.

Figure 2:
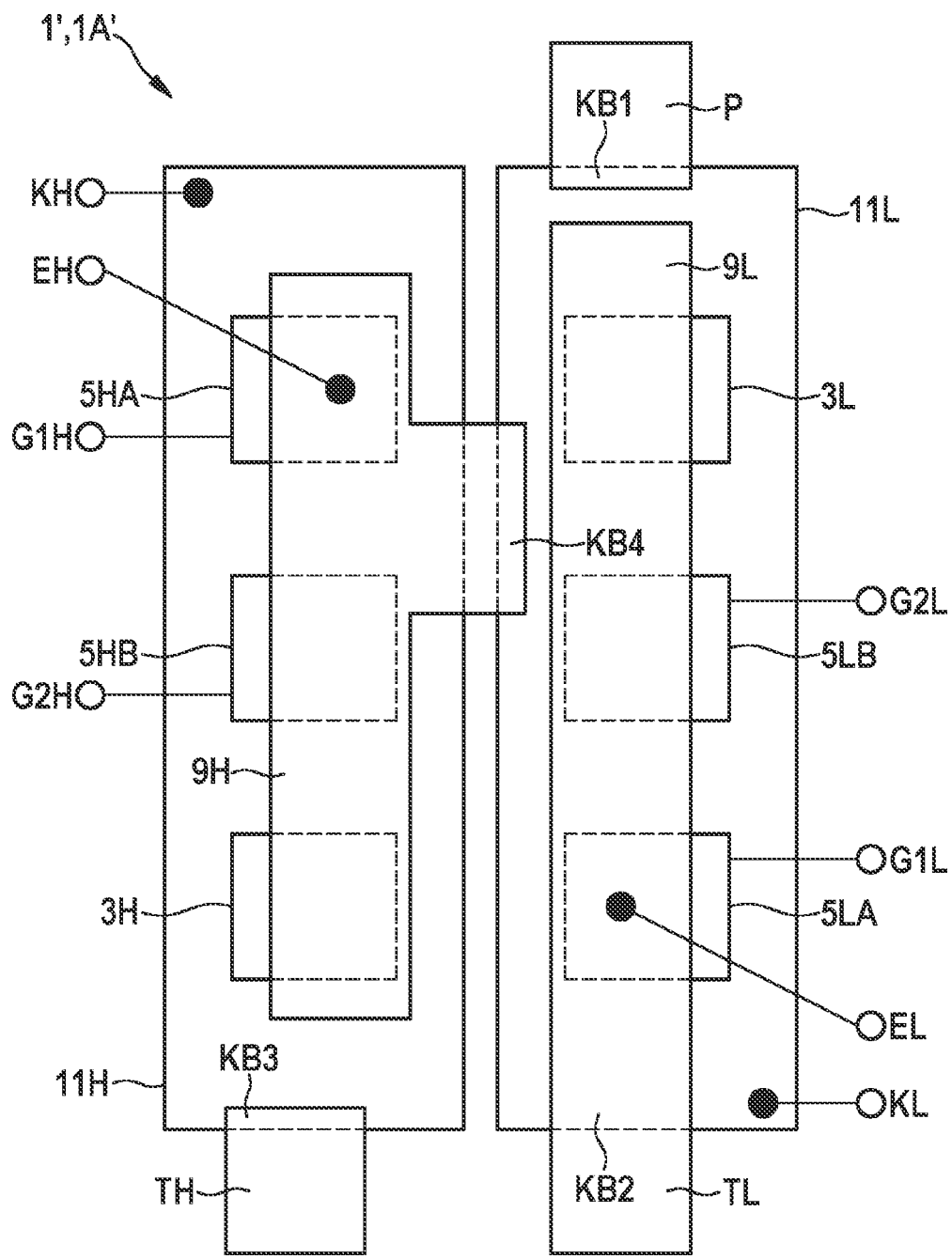
FIG. 2 shows a schematic illustration of a conventional semiconductor power module from the related art.

As is further shown in FIGS. 1 and 3, semiconductor power module 1 in the illustrated exemplary embodiment is designed as a B2 bridge 1A. Therefore, an alternating voltage potential is present at first external power contact P. A first direct voltage potential is present at second external power contact TL, and a second direct voltage potential is present at third external power contact TH. Analogously to conventional semiconductor power module 1' from the related art illustrated in FIG. 2, power transistors 5LA, 5LB, 5HA, 5HB are each designed as insulated gate bipolar transistors (IGBTs). In the illustrated exemplary embodiment of semiconductor power module 1, first power transistor 5LA and second power transistor 5LB connected in parallel form a low-side path between second external power contact TL and first external power contact P. Third power transistor 5HA and fourth power transistor 5HB connected in parallel form a high-side path between third external power contact TH and first external power contact P. In addition, a first free-wheeling diode 3L is situated in the low-side path in parallel to first power transistor 5LA and to second power transistor 5LB, between first collector strip conductor 11L and first emitter strip conductor 9L. A second free-wheeling diode 3H is situated in the high-side path in parallel to third power transistor 5HA and to fourth power transistor 5HB, between second collector strip conductor 11H and second emitter strip conductor 9H. The two collector strip conductors 11L, 11H are spaced apart from one another in the same plane and are coupled to a cooling device, not illustrated. Therefore, the two collector strip conductors 11L, 11H each act as a heat sink for dissipating heat from semiconductor power module 1. In addition, the heat of power transistors 5LA, 5LB, 5HA, 5HB and of free-wheeling diodes 3L, 3H is dissipated via respective collector strip conductor 11L, 11H.

First external power contact P is directly connected to the surface of first collector strip conductor 11L at first contact area KB1 and undergoes heat dissipation via same. In the illustrated exemplary embodiment, second external power contact TL is connected to first emitter strip conductor 9L at a second contact area KB2 via first connecting element 14.

In the illustrated exemplary embodiment, first connecting element 13 has a U-shaped design, so that an air gap 15 is formed between second connecting element 13 and second emitter strip conductor 9B, except at second contact area KB2. Furthermore, in the illustrated exemplary embodiment a heat dissipation system 20 that includes an electrically insulating intermediate layer, not illustrated, that is integrally joined to first connecting element 13 via a first solder layer and integrally joined to first collector strip conductor 11L via a second solder layer is situated in the area of second external power contact TL. The electrically insulating intermediate layer forms an electrically insulated heat dissipation path between first connecting element 13 and first collector strip conductor 11L, which dissipates the heat of second external power contact TL. The electrically insulating intermediate layer, not illustrated, is designed as an AMB ceramic substrate, for example, and has good to very good heat conductivity in a range of 20 to 200 W/mK. The AMB ceramic substrate has a copper structure as a solderable surface at both surfaces, so that the integrally joined solder layers in question may be created for heat dissipation between first connecting element 13 and the electrically insulating intermediate layer, and between the electrically insulating intermediate layer and first collector strip conductor 11L. Of course, the electrically insulating intermediate layer may alternatively be designed as a DBC substrate or as an IMS substrate or as a piece of ultra-pure silicon. Third external power contact TH is directly connected to the surface of second collector strip conductor 11H at third contact area KB3 and undergoes heat dissipation via same. In addition, illustrated semiconductor power module 1 includes even further external contacts KH, EH, G1H, G2H, KL, EL, G1L, G2L. External contact KL is connected to first collector strip conductor 11L or the collector terminals of power transistors 5LA, 5LB of the low side of semiconductor power module 1 via a bonding wire. External contact EL is connected to first emitter strip conductor 9L or emitter terminals of power transistors 5LA, 5LB of the low side of semiconductor power module 1 via a bonding wire. External contact G1L is connected to a gate terminal of first power transistor 5LA of the low side of semiconductor power module 1 via a bonding wire. External contact G2L is connected to a gate terminal of second power transistor 5LB of the low side of semiconductor power module 1 via a bonding wire. Analogously, external contact KH is connected to second collector strip conductor 11H or collector terminals of power transistors 5HA, 5HB of the high side of semiconductor power module 1 via a bonding wire. External contact EH is connected to second emitter strip conductor 9H or emitter terminals of power transistors 5HA, 5HB of the high side of semiconductor power module 1 via a bonding wire. External contact G1H is connected to a gate terminal of third power transistor 5HA of the high side of semiconductor power module 1 via a bonding wire. External contact G2H is connected to a gate terminal of fourth power transistor 5HB of the high side of semiconductor power module 1 via a bonding wire.

As is further shown in FIG. 1, second contact area KB2 is mechanically shifted in the direction of second power transistor 5LB, which is spatially farther from second power contact TL than is first power transistor 5LA, based on the distance between first power transistor 5LA and second power transistor 5LB. In addition, a first control voltage is applied between external emitter contact EL and first external gate contact G1L that is connected to the control connection of first power transistor 5LA. A second control voltage is applied between external emitter contact EL and second external gate contact G2L that is connected to the control connection of second power transistor 5LB. External emitter contact EL is connected to first emitter strip conductor 9LB at an emitter contacting point EK. Emitter contacting point EK with first emitter strip conductor 9LB is mechanically shifted in the direction of first power transistor 5LA, based on the distance between first power transistor 5LA and second power transistor 5LB.

In FIG. 3, reference symbol R in each case denotes a corresponding line resistance, and reference symbol L denotes a corresponding line inductance. The factors denoted by reference symbol x may be set by the positioning of second contact area KB2 and/or of emitter contacting point EK in order to adapt the ohmic line resistances and the line inductances to the emitter of power transistors 5LA, 5LB or to the anode of free-wheeling diode 3L.

Figure 4:
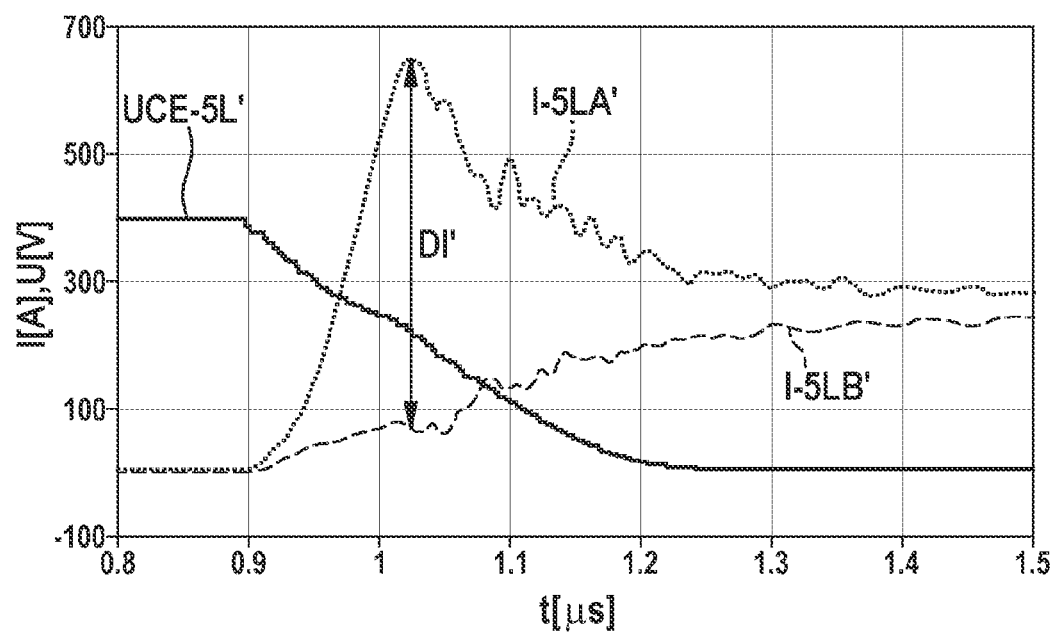
FIG. 4 shows a characteristic curve diagram of the switching behavior of the conventional semiconductor power module from FIG. 2.
Figure 5:
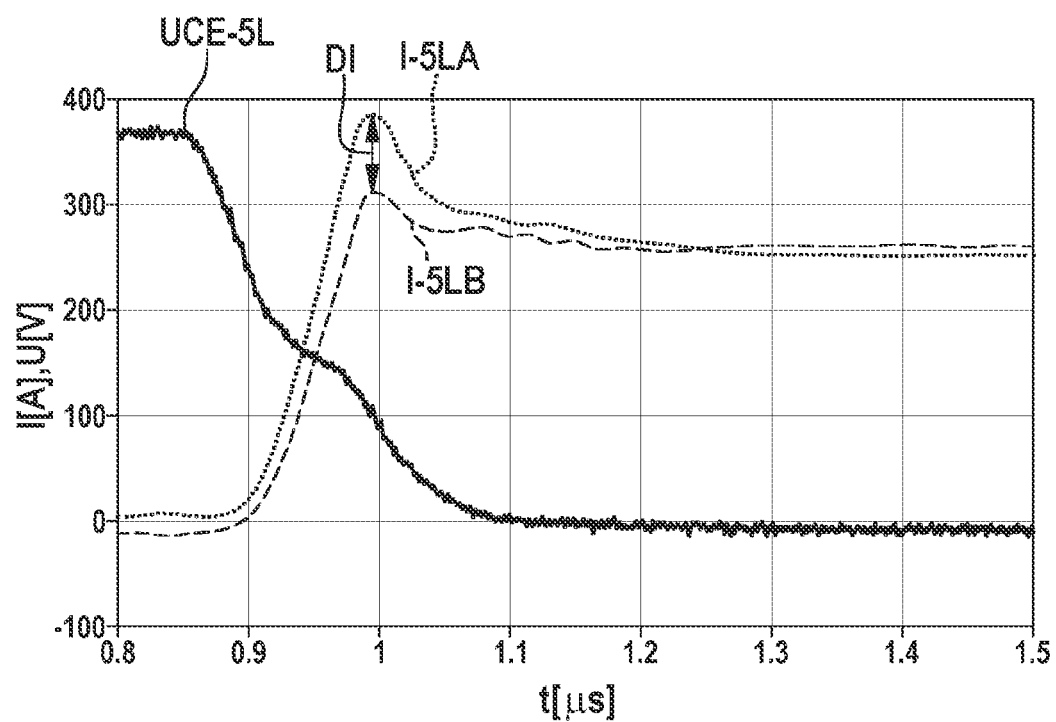
FIG. 5 shows a characteristic curve diagram of the switching behavior of the semiconductor power module according to the present invention from FIGS. 1 and 3.

As is apparent from a comparison of the two characteristic curve diagrams in FIGS. 4 and 5, by use of specific embodiments of semiconductor power module 1 according to the present invention the current distribution over the two power transistors 5LA, 5LB may be set in such a way that a current difference DI, illustrated in FIG. 5, between a current flow I-5LA through first power transistor 5LA and a current flow I-5LB through second power transistor 5LB is much lower compared to current difference DI', illustrated in FIG. 4, for same voltage pattern UCE-5L.

What is claimed is:

1. A semiconductor power module, comprising:
a first power transistor and a second power transistor that are situated in parallel between a first collector strip conductor and a first emitter strip conductor, a first connection surface of each of the first and second power transistors being electroconductively connected to the first collector strip conductor, a second connection surface of each of the first and second power transistors being electroconductively connected to the first emitter strip conductor, so that a current flowing between the first collector strip conductor and the first emitter strip conductor is divided between the first and second power transistors when the first and second power transistors are each conductively connected via an applied control voltage, a first external power contact being directly contacted with the first collector strip conductor at a first contact area, a second external power contact being contacted with the first emitter strip conductor at a second contact area via a first connecting element, and the second contact area being positioned mechanically asymmetrically between the first and second power transistors connected to the first emitter strip conductor in such a way that an electrical symmetry with identical effective control voltages results at the first and second power transistors;
wherein a heat dissipation system that includes an electrically insulating intermediate layer is situated in an area of the second external power contact, the electrically insulating intermediate layer being integrally joined to the first connecting element via a first solder layer and integrally joined to the first collector strip conductor via a second solder layer, the electrically insulating intermediate layer forming an electrically insulated heat dissipation path between the first connecting element and the first collector strip conductor, which dissipates heat of the second external power contact.

2. The semiconductor power module as recited in claim 1, wherein a third power transistor and a fourth power transistor are situated in parallel between a second collector strip conductor and a second emitter strip conductor, a first connection surface of each of the third and fourth power transistors being electroconductively connected to the second collector strip conductor, and a second connection surface of each of the third and fourth power transistors being electroconductively connected to the second emitter strip conductor, so that a current flowing between the second collector strip conductor and the second emitter strip conductor is divided between the third and fourth power transistors when the third and fourth power transistors are each conductively connected via an applied control voltage, a third external power contact being directly contacted with the second collector strip conductor at a third contact area, and the second emitter strip conductor being contacted with the first collector strip conductor at a fourth contact area via a second connecting element.

3. The semiconductor power module as recited in claim 2, wherein the first power transistor and the second power transistor connected in parallel form a low-side path between the second external power contact and the first external power contact, and the third power transistor and the fourth power transistor connected in parallel form a high-side path between the third external power contact and the first external power contact.

4. The semiconductor power module as recited in claim 3, wherein a first free-wheeling diode is situated in parallel to the first power transistor and to the second power transistor, between the first collector strip conductor and the first emitter strip conductor, and a second free-wheeling diode is situated in parallel to the third power transistor and to the fourth power transistor, between the second collector strip conductor and the second emitter strip conductor.

5. The semiconductor power module as recited in claim 2, wherein the fourth contact area is positioned mechanically and electrically symmetrically between the third and fourth power transistors, based on a distance between the third power transistor and the fourth power transistor connected in parallel.

6. The semiconductor power module as recited in claim 1, wherein the second contact area is mechanically shifted in a direction of the second power transistor, which is spatially farther from the second power contact than is the first power transistor, based on the distance between the first power transistor and the second power transistor.

7. The semiconductor power module as recited in claim 6, wherein a first control voltage is applied between an external emitter contact and a first external gate contact that is connected to a control connection of the first power transistor.

8. The semiconductor power module as recited in claim 7, wherein a second control voltage is applied between the external emitter contact and a second external gate contact that is connected to a control connection of the second power transistor.

9. The semiconductor power module as recited in claim 7, wherein the external emitter contact is connected to the first emitter strip conductor at an emitter contacting point.

10. The semiconductor power module as recited in claim 9, wherein the emitter contacting point with the first emitter strip conductor is mechanically shifted in a direction of the first power transistor, based on a distance between the first power transistor and the second power transistor.

11. The semiconductor power module as recited in claim 1, wherein the first connecting element has a U-shaped design, so that an air gap is formed between the second connecting element and the second emitter strip conductor, except at the second contact area.

\* \* \* \* \*